United States Patent
Gu et al.

(10) Patent No.: US 8,541,307 B2
(45) Date of Patent: Sep. 24, 2013

(54) TREATMENT METHOD FOR REDUCING PARTICLES IN DUAL DAMASCENE SILICON NITRIDE PROCESS

(75) Inventors: Meimei Gu, Shanghai (CN); Duoyuan Hou, Shanghai (CN); Jun Xu, Shanghai (CN); Ke Wang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 68 days.

(21) Appl. No.: 13/339,400

(22) Filed: Dec. 29, 2011

(65) Prior Publication Data

US 2013/0084701 A1    Apr. 4, 2013

(30) Foreign Application Priority Data

Sep. 29, 2011    (CN) .......................... 2011 1 0299091

(51) Int. Cl.
    *H01L 21/44*    (2006.01)
(52) U.S. Cl.
    USPC ........... 438/687; 438/626; 438/629; 438/905; 257/E21.295
(58) Field of Classification Search
    USPC ................. 438/687, 626, 629, 631, 677, 905; 257/E21.295
    See application file for complete search history.

(56) References Cited

U.S. PATENT DOCUMENTS

| | | | | |
|---|---|---|---|---|
| 6,872,323 | B1 * | 3/2005 | Entley et al. | 216/67 |
| 7,094,705 | B2 * | 8/2006 | Lin et al. | 438/710 |
| 7,163,889 | B2 * | 1/2007 | Yu et al. | 438/627 |
| 7,858,510 | B1 * | 12/2010 | Banerji et al. | 438/598 |
| 8,268,722 | B2 * | 9/2012 | Yu et al. | 438/644 |

* cited by examiner

*Primary Examiner* — Michael Trinh
(74) *Attorney, Agent, or Firm* — Renner, Otto, Boisselle & Sklar, LLP

(57) ABSTRACT

A treatment method for reducing particles in a Dual Damascene Silicon Nitride (DDSN) process, including the following steps: forming a seed layer of copper on a silicon wafer; depositing a deposition layer of copper to cover the seed layer of copper; planarizing the deposition layer of copper; providing the silicon wafer into a reaction chamber and performing a pre-treatment on a surface of the deposition layer of copper using $NH_3$ gas under a plasma condition so as to reduce copper oxide (CuO) to copper (Cu) formed on the deposition layer of copper; in the reaction chamber, generating an etching block layer on the deposition layer of copper using a DDSN deposition process; cleaning the reaction chamber using $NF_3$ gas; and directing $N_2O$ gas into the reaction chamber and removing the remaining hydrogen (H) and fluorine (F) in the reaction chamber using the $N_2O$ gas under the plasma condition.

4 Claims, 1 Drawing Sheet

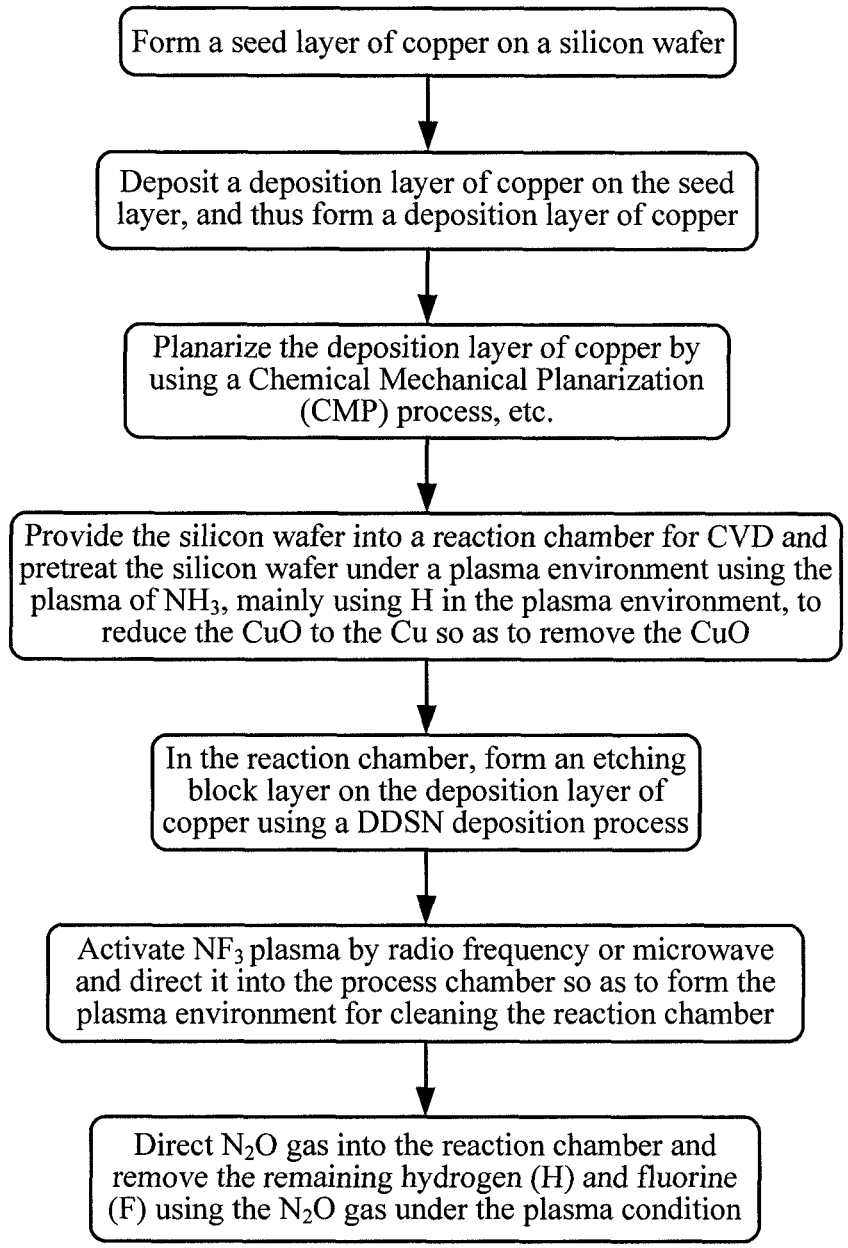

TREATMENT METHOD FOR REDUCING PARTICLES IN DUAL DAMASCENE SILICON NITRIDE PROCESS

CROSS REFERENCE TO RELATED APPLICATIONS

The present invention claims priority under 35 U.S.C. §119 to Chinese Patent Application No. 201110299091.X, filed on Sep. 29, 2011, the entire content of which is incorporated herein by reference.

TECHNICAL FIELD

The present invention relates to a treatment method for reducing particles in a Dual Damascene Silicon Nitride (i.e., DDSN) process in semiconductor manufacturing fields, and more particularly, to a treatment method for reducing particles in the DDSN process during a copper manufacturing process.

BACKGROUND

During the DDSN process, a form of DDSN/Oxide/DDSN/Oxide/DDSN thin film stacking layers is mainly used, and the DDSN serves as an etching blocking layer in a damascene structure of an intermetal dielectric layer and is typically used in a 130 nm, 110 nm copper manufacturing process.

For the Chemical Vapor Deposition (CVD) device of AMAT Producer, DDSN is in contact with a metal copper (Cu) below during the DDSN process, and a copper oxide (CuO) is prone to be formed on a surface of the metal copper (Cu) when placed in the air. The existence of such copper oxide (CuO) may damage the adhesion between the copper (Cu) and the DDSN thin film, influence the reliability and qualification rate in the subsequent integration processes, and even cause peeling of the thin film from a product such that the product is scrapped. Before depositing the first layer of DDSN, a $NH_3$ pre-treatment is carried out under a plasma environment using ammonia gas. In this way, the CuO can be removed by using hydrogen ion ($H^+$) to reduce the copper oxide (CuO) to the copper (Cu). However, at the same time, because the main ingredient of the surface of the process chamber is aluminum oxide ($Al_2O_3$), the remaining hydrogen ion ($H^+$) during the $NH_3$ pre-treatment may corrode the surface of the process chamber (especially a showerhead) that has the main ingredient of aluminum oxide ($Al_2O_3$), thereby causing particle gathering. In addition, the remaining fluorine ion ($F^-$) during a cleaning process using $NF_3$ may also corrode the surfaces of the process chamber and the showerhead, which also causes particle gathering. Such corrosion to the process chamber may shorten the life of the showerhead, resulting in increased frequency of maintenance for the process chamber.

SUMMARY OF THE INVENTION

Aiming at the existing problems described above, an object of the present invention is to provide a method which can effectively remove the copper oxide (CuO) in the DDSN process, and reduce the particles on the surface of the process chamber, especially the particles on the surface of the showerhead.

The object of the present invention is realized by the following technical solutions.

A method for reducing particles in a DDSN process is provided, which includes the following steps:

Step A: forming a seed layer of copper on a silicon wafer;

Step B: depositing a deposition layer of copper on the seed layer of copper to cover the seed layer of copper;

Step C: planarizing the deposition layer of copper;

Step D: providing the silicon wafer into a reaction chamber and performing a pre-treatment on a surface of the deposition layer of copper using $NH_3$ gas under a plasma condition so as to remove oxides of copper formed on the deposition layer of copper;

Step E: in the reaction chamber, generating an etching block layer on the deposition layer of copper using a DDSN deposition process;

Step F: cleaning the reaction chamber using $NF_3$ gas; and

Step G: directing $N_2O$ gas into the reaction chamber and removing remaining hydrogen and fluorine in the reaction chamber using the $N_2O$ gas under the plasma condition.

In the above treatment method for reducing particles in a DDSN process, wherein, under the plasma condition, an atmospheric pressure in the reaction chamber is a deposition atmospheric pressure of the DDSN deposition process, a spacing from a showerhead of the reaction chamber to the silicon wafer is 450-600 mils, power of radio frequency for generating plasma is 0-2000 W, and a gas flow rate of the $N_2O$ gas is 3000-7000 sccm.

In the above method, wherein, $N_2$ gas is also directed into the reaction chamber while the $N_2O$ gas is directed into the reaction chamber, and a flow rate of the $N_2$ gas is 3000-7000 sccm.

The above method further includes a step of growing an oxide layer on the etching block layer.

Compared with the prior art, the present invention has the following advantageous effects: the operation is simple; the copper oxide (CuO) can be effectively removed so as to ensure the adhesion between copper (Cu) and the DDSN thin film, and at the same time, the corrosion of the surface of the process chamber, especially the corrosion of the showerhead, can be suppressed, and therefore an effect of prolonging the service life of the process chamber and reducing the maintenance frequencies for the process chamber can be realized.

BRIEF DESCRIPTION OF THE DRAWINGS

FIG. 1 is a process flow chart of a treatment method for reducing particles in a DDSN process according to the present invention.

DESCRIPTION OF THE PREFERRED EMBODIMENTS

The description of the present invention will be made hereinafter with reference to the schematic diagram and specific operation embodiments.

As shown in FIG. 1, a seed layer of copper is formed on a silicon wafer by using, e.g., sputtering method, then a metal copper is deposited on the seed layer and therefore a deposition layer of copper is formed. Next, the deposition layer of copper is subject to a planarization treatment by using a Chemical Mechanical Planarization (CMP) process. Subsequently, the silicon wafer is provided into a CVD reaction chamber, and a pre-treatment is performed on a surface of the deposition layer of copper by using the plasma of $NH_3$ gas in a plasma environment condition, mainly using H in the plasma environment, to reduce CuO to Cu so as to realize the object of removing CuO on the surface of the deposition layer of copper and thus to ensure the adhesion between the copper and a subsequent DDSN thin film. During this process, using hydrogen ion ($H^+$) to reduce copper oxide (CuO) to copper (Cu) so as to remove copper oxide (CuO) is the basis for forming a DDSN deposition layer, and in the subsequent DDSN deposition process, the formed DDSN thin film is actually a silicon nitride etching block layer lying on the deposition layer of copper. Thereafter, $NF_3$ plasma is activated by using radio frequency or microwave and is directed to the CVD process chamber to form a plasma environment, so that the generated active neutral fluorine reacts with the residues (e.g., $SiO_2$ and so on) in the process chamber and thus a volatile etch product (e.g., $SiF_4$) is formed. Such volatile product may be extracted out of the CVD reaction chamber, and thus a cleaning of the reaction chamber is completed. Under normal conditions, the main ingredient of the material of the surface of the process chamber, especially the surface of the showerhead, is $Al_2O_3$. One disadvantage is that, because the remaining hydrogen ion ($H^+$) in the pre-treatment using $NH_3$ and the remaining fluorine ion ($F^-$) in the cleaning process using $NF_3$ are both tended to react chemically with the $Al_2O_3$, the corrosion of the process chamber, especially the corrosion of the showerhead, is caused, and the corrosive usually appears as white particles. With $N_2O$ being directed into the process chamber and by ensuring the atmospheric pressure in the process chamber being the deposition atmospheric pressure of the DDSN thin film process (i.e., DDSN deposition process), the plasma of $N_2O$ gas is formed in the process chamber using radio frequency. Because in the process chamber the silicon wafer is usually placed on a heating stage, a heater spacing from a gas showerhead to the heating stage may be set to 450-600 mils, and at this time the spacing from the gas showerhead to the silicon wafer can be deemed to about 450-600 mils. The radio frequency power for generating the plasma of $N_2O$ gas is preferably to be 0-2000 W, the gas flow rate of the $N_2O$ gas directed into the process chamber is 3000-7000 sccm, and the gas flow rate of $N_2$ which is directed simultaneously is 3000-7000 sccm. Under the radio frequency power, the plasma environment is formed in the chamber. In the plasma environment, the $N_2O$ gas decomposes oxygen ions ($O^-$, $O^{2-}$), the oxygen ions may remove the remaining hydrogen ions by reaction (e.g., $O^{2-}+2H^+ \rightarrow H_2O$) and exchange with the fluorine ions absorbed on the walls of the process chamber (to prevent $F^-$ from further corroding the $Al_2O_3$).

After the above processes, the problem of generating particles on the inner walls of the reaction chamber or the gas showerhead as mentioned above can be eliminated. Thereafter, an oxide layer may be grown on the etching block layer and subsequent manufacturing processes of standard damascene structure may be implemented so as to complete the subsequent preparations of the damascene structure.

As known by those skilled in this art, the main ingredient of the surface of the CVD reaction chamber or the gas showerhead mentioned in the present invention is $Al_2O_3$, and the remaining hydrogen (H) or fluorine (F) in the above-mentioned processes may have corrosion function on the $Al_2O_3$ surface. The present invention removes the remaining hydrogen and fluorine by using the plasma of $N_2O$ in the plasma environment, and therefore in the DDSN process, the particles generated due to the corrosion of $Al_2O_3$ in the process can be greatly reduced while the CuO can be effectively removed. In addition, if the CVD machine is needed to be operated again to perform normal production after suspension for some time, a seasoning action will necessarily be taken before the operation of the CVD machine, i.e., preheating the machine to reach a stable process state, so as to avoid differences between the previous silicon wafers and the subsequent ones in the same batch. Thus, during the cleaning process of the CVD machine, directing the $N_2O$ gas into the reaction chamber may be performed after the $NF_3$ cleaning but before the seasoning action is performed.

Although detailed description of the specific embodiments of the present invention have been disclosed hereinbefore, the present invention is not limited to the above-described specific embodiments and those specific embodiments are only exemplary. Those skilled in the art will appreciate that any equivalent modification or substitution of the present invention is within the scope of the present invention. Therefore, various equivalent changes and modifications made without departing from the scope and spirit of the invention are within the scope of the present invention.

What is claimed is:

1. A treatment method for reducing particles in a Dual Damascene Silicon Nitride (DDSN) process, characterized by comprising steps of:
   Step A: forming a seed layer of copper on a silicon wafer;
   Step B: depositing a deposition layer of copper to cover the seed layer of copper;
   Step C: planarizing the deposition layer of copper;
   Step D: providing the silicon wafer into a reaction chamber and performing a pre-treatment on a surface of the deposition layer of copper using $NH_3$ gas under a plasma condition so as to remove oxides of copper formed on the deposition layer of copper;
   Step E: in the reaction chamber, generating an etching blocking layer on the deposition layer of copper using a DDSN deposition process;
   Step F: cleaning the reaction chamber using $NF_3$ gas; and
   Step G: directing $N_2O$ gas into the reaction chamber and removing remaining hydrogen and fluorine in the reaction chamber using the $N_2O$ gas under the plasma condition.

2. The treatment method for reducing particles in a DDSN process according to claim 1, characterized in that, under the plasma condition, an atmospheric pressure in the reaction chamber is a deposition atmospheric pressure of the DDSN deposition process, spacing from showerhead of the reaction chamber to the silicon wafer is 450-600 mils, power of radio frequency for generating plasma is 0-2000 W, and a gas flow rate of the $N_2O$ gas is 3000-7000 sccm.

3. The treatment method for reducing particles in a DDSN process according to claim 2, characterized in that $N_2$ gas is also directed into the reaction chamber while the $N_2O$ gas is directed into the reaction chamber, and a flow rate of the $N_2$ gas is 3000-7000 sccm.

4. The treatment method for reducing particles in a DDSN process according to claim 1, characterized by further comprising a step of growing an oxide layer on the etching block layer.

* * * * *